United States Patent [19]

Creed et al.

[11] Patent Number: 5,708,613
[45] Date of Patent: Jan. 13, 1998

[54] HIGH PERFORMANCE REDUNDANCY IN AN INTEGRATED MEMORY SYSTEM

[75] Inventors: Francis Anthony Creed, Jericho, Vt.; Mark Beiley, Chandler, Ariz.; Charles Edward Drake, Underhill; Peter Joel Jenkins, Colchester, both of Vt.

[73] Assignee: International Business Machines Corporation, Armonk, N.Y.

[21] Appl. No.: 681,152

[22] Filed: Jul. 22, 1996

[51] Int. Cl.$^6$ .................................................. G11C 7/00
[52] U.S. Cl. ................................. 365/200; 365/194
[58] Field of Search .............................. 365/200, 194, 365/233; 371/10.1, 10.2

[56] References Cited

U.S. PATENT DOCUMENTS

| | | | |
|---|---|---|---|
| 4,723,227 | 2/1988 | Murotani | 365/200 |
| 4,740,923 | 4/1988 | Kaneko et al. | 365/194 |
| 4,870,622 | 9/1989 | Aria et al. | 365/230.02 |
| 5,034,925 | 7/1991 | Kato | 365/200 |
| 5,036,494 | 7/1991 | Wise et al. | 365/230.03 |
| 5,053,998 | 10/1991 | Kannan | 365/154 |
| 5,062,082 | 10/1991 | Choi | 365/230.06 |
| 5,134,616 | 7/1992 | Barth, Jr. et al. | 371/10.3 |
| 5,228,003 | 7/1993 | Tokuda | 365/233.5 |
| 5,233,557 | 8/1993 | Sakagami et al. | 365/189.01 |
| 5,301,153 | 4/1994 | Johnson | 365/200 |
| 5,369,622 | 11/1994 | McLaury | 365/233 |
| 5,377,157 | 12/1994 | Matsumoto et al. | 365/230.05 |
| 5,379,261 | 1/1995 | Jones, Jr. | 365/230.01 |
| 5,418,747 | 5/1995 | Tobita | 365/194 |
| 5,465,232 | 11/1995 | Ong | 365/205 |
| 5,519,657 | 5/1996 | Arimoto | 365/200 |
| 5,539,698 | 7/1996 | Suzuki | 365/200 |

*Primary Examiner*—A. Zarabian
*Attorney, Agent, or Firm*—Schmeiser, Olsen & Watts; Eugene Shkurko, Esq.

[57] ABSTRACT

The preferred embodiment of the present invention provides a memory system for use in a computer system that improves the performance of a bit redundancy steering mechanism. The preferred embodiment provides a timing signal path to the bit steering mechanism with a delay shorter than that to the memory data array. Additionally, the required address signals are provided to the bit steering mechanism before the addresses are provided to the memory data array. This is preferably accomplished by bypassing the buffers and providing the address signals directly to the bit steering mechanism.

11 Claims, 2 Drawing Sheets

HIGH PERFORMANCE REDUNDANCY IN AN INTEGRATED MEMORY SYSTEM

BACKGROUND OF THE INVENTION

1. Technical Field

This invention generally relates to computer memory systems and more specifically to cache memory.

2. Background Art

The proliferation of electronics in our modern world is in large part due to the increased economies of scale created by large scale manufacturing combined with increased manufacturing yield. Thus, there has been a continual drive in the semiconductor fabrication industry to increase fabrication yields. Increasing yields decreases device fabrication costs, allowing competitive pricing. One area where increased yields has been particularly important is in memory fabrication. Memory devices, such as Dynamic Random Access Memory (DRAM) or Static Random Access Memory (SRAM), contain a large number of memory cells, and as such are particularly sensitive to manufacturing defects. In an effort to improve memory fabrication yields redundant devices, such as redundant bit and word lines have been fabricated into the memory. The memory is tested during fabrication and defective bit and/or word lines are replaced with the redundant elements. Thus, memory with some defects can be salvaged, increasing the fabrication yield.

Unfortunately, providing a large number of redundant bit lines requires excessive space on the memory device. With the density of memory devices ever increasing, the requirement of numerous redundant bit lines has become more onerous. For this reason, technologies have evolved that facilitate the use of a redundant line as a replacement for any of a large number of lines. For example, one redundant bit line can be used to replace any of 64 bit lines that may be damaged. This arrangement provides effective redundancy, increasing fabrication yield without requiring an excessive number of redundant lines.

One effective technology providing redundancy has been bit steering. For example, U.S. Pat. No. 5,134,616, "Dynamic RAM with On-Chip ECC and Optimized Bit and Word Redundancy," (issued to Barth et al. and assigned to International Business Machines, Inc.) discloses a memory system that uses bit steering to provide redundant data lines. Bit steering uses logic to control which data lines, if any, are to be replaced with redundant data lines during each cycle.

Unfortunately the bit steering logic introduces delays in the memory system that affect memory access time, degrading system performance. This is especially significant in integrated memory/logic systems where overall performance is paramount, for example, in integrated L2 cache systems. Thus, what is needed is an improved memory system with a faster and more efficient bit steering redundancy system.

DISCLOSURE OF INVENTION

The present invention provides a memory system for use in a computer system that improves the performance of a bit redundancy steering mechanism, thus improving overall system performance. A timing signal path is provided to the bit steering mechanism with a delay shorter than that to the memory data array. Additionally, the required address signals are provided from the memory control logic to the bit steering mechanism before the addresses are provided to the memory data array. This is preferably accomplished by bypassing the buffers and providing the address signals directly to the bit steering mechanism. This has the advantage of improving the speed of the bit redundancy system.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Figure 1:
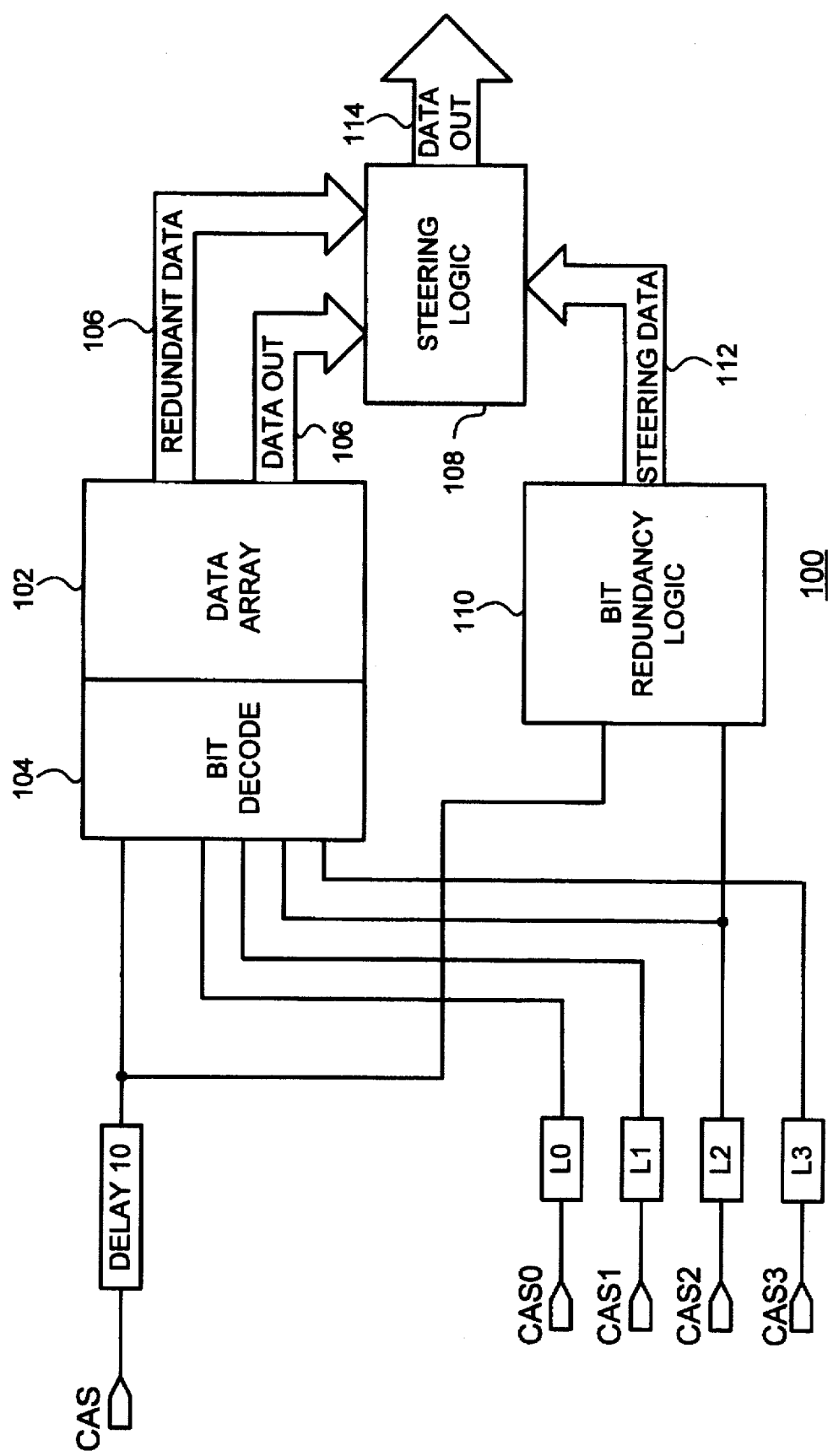
FIG. 1 is a schematic view of a memory system 100.

Turning now to FIG. 1, FIG. 1 illustrates one method of implementing a memory system 100 that uses bit steering as a redundancy technique. The memory system is integrated in the sense that the controller, memory array and other features are all preferably part of one device. The major elements of the memory system 100 include a bit decoder 104, a data array 102, steering logic 108 and bit redundancy logic 110. The memory system 100 receives a column address strobe (CAS) for timing and a plurality of column address signals (CAS 0, CAS 1, CAS 2, and CAS 3) to address data in data array 102. These signals are typically provided by the memory system controller (not shown in FIG.). The CAS 0–3 signals are latched by buffers L0–L3 respectively. The buffers assure that the CAS 0–3 signals are available for use by bit decode 104 when required.

The data array 102 includes an array of memory storage devices such as DRAM. A DRAM array typically comprises multiple sub-arrays called "blocks," with each block comprising an array having a plurality of word lines and bit lines. The DRAM array structure comprises 16 blocks, with each block containing 128 word lines and 2048 bit lines. Additionally, each block contains 32 redundant bit lines. Thus, each block has 128 word lines with each word line accessing 2048 bits plus 32 redundant bits.

The bits in the array are accessed according to their block, word line, and bit line location. This is accomplished using a variety of addressing signals. In particular, block and row addresses are used to select one of 16 blocks, and one of 128 word lines in the selected block. For clarity reasons these address signal inputs are not illustrated in FIG. 1.

With a word line addressed, column address signals are used to address groups of bits in the selected word line, called columns, with those bits being outputted from data array 102. In the illustrated embodiment, four column address signals CAS 0–3 are used to address 16 columns of bits in the word line. In the DRAM array with a word line that accesses 2048 bits and 32 redundant bits, each of these 16 columns would comprise 128 bits and 2 redundant bits. The data output 106 of data array 102 then comprises the data stored in the column's 128 bits and 2 redundant bits of the selected block and word line.

The memory system 100 uses bit steering as a way to determine which, if any, of the bits in a column are replaced by one of the redundant bits. This is facilitated by testing the memory system 100 for defective bits during fabrication.

The location of defective bit lines is then hardwired into the bit redundancy logic 110, usually by using a laser to blow integrated fuses. When data is accessed, the bit redundancy logic 110 provides steering data to direct the steering logic 108 as to which bits in a selected column are on defective bit lines and need to be replaced by redundant bits on the redundant bit lines. The steering logic then replaces the output of defective bits with the appropriate redundant bit output. Thus, the data output 114 of the steering logic 108 includes a plurality of data lines with any defective bits having been replaced with a redundant bit. This data output 114 can then be used by the computer system. In the DRAM example, the data output comprises 128 bits, with up to two of those bits comprising outputs from the redundant bit lines.

The bit redundancy logic 110 and bit decoder 104 receive a timing strobe (CAS) for timing. CAS travels through a DELAY 10 on its way to bit redundancy logic 110 and bit decoder 104. The DELAY 10 is provided to assure the CAS arrives at the bit decoder at the right time relative to the address signals. The CAS tells the bit redundancy logic 110 when to provide steering data to the steering logic 108 and provides a timing signal for bit decoder 104.

The bit redundancy logic 110 also receives a CAS 2 signal. The CAS 2 signal is used in combination with the blown fuses by bit redundancy logic 110 to determine which bits are to be replaced. In particular, the CAS 2 signal is used to control which bits to be replaced. The bit redundancy logic 110 then provides steering data directly to steering logic 108, to replace the output of a defective bit line with the appropriate redundant bit line output.

Generally, the steering logic 108 outputs data to data output 114 as soon as received from data array 102. If the data arrives from data array 102 before steering data arrives, the incorrect data will be temporarily outputted. Thus, in order to avoid glitches at the data output 114, the correct steering data must arrive at the steering logic 108 before the data arrives from the data array. Otherwise improper data could appear at the data output 114 until the proper steering data arrives. Thus, the speed at which the memory system 100 operates is often limited by the speed at which the bit redundancy logic 110 provides the correct steering data to the steering logic 108. This is particularly problematic where the bit redundancy logic 110 has a greater propagation delay than bit decode 104 and data array 102.

Figure 2:
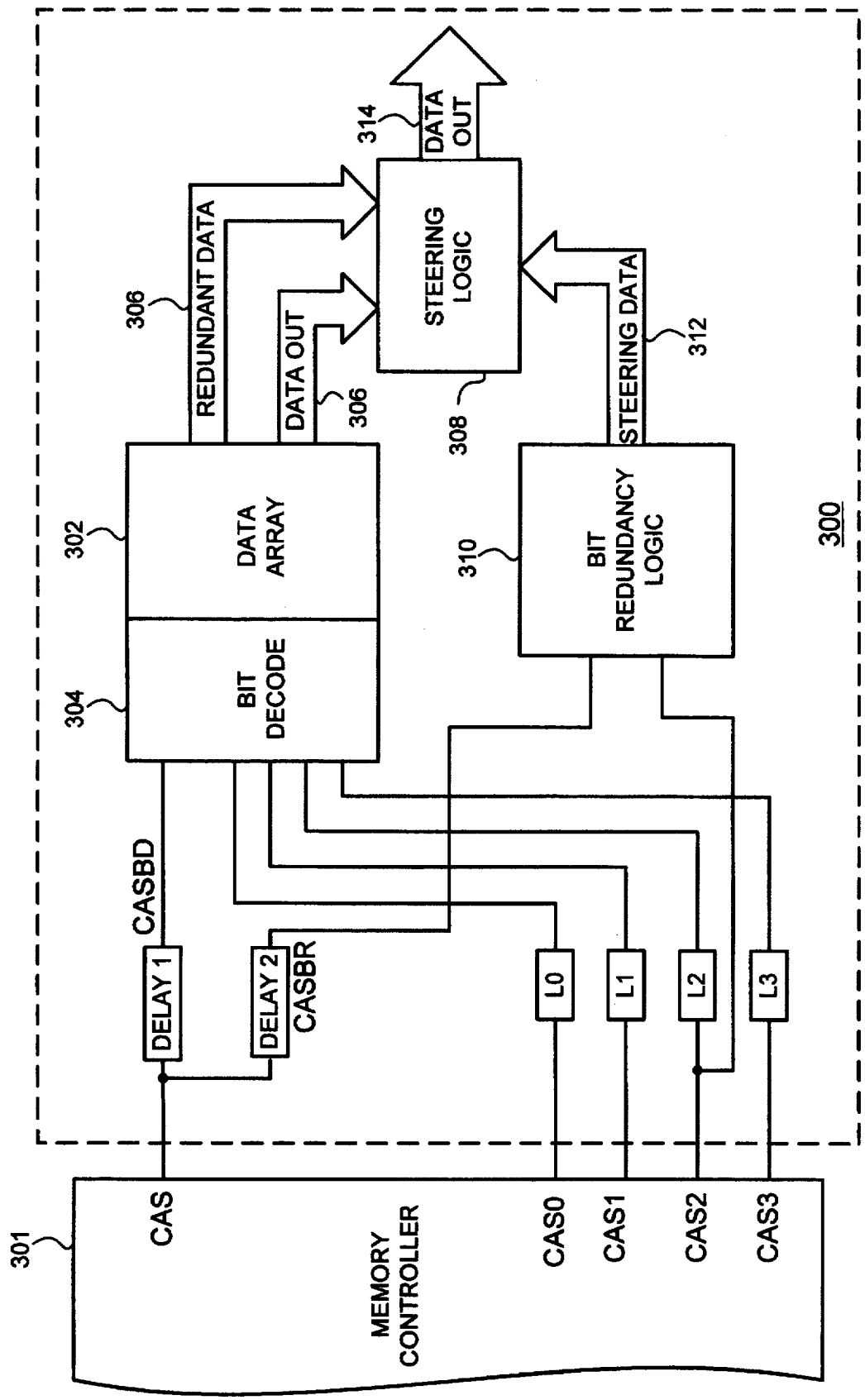
FIG. 2 is a schematic view of a memory system 300 in accordance with the preferred embodiment of the present invention.

FIG. 2 is a schematic view of a memory system 300 in accordance with the preferred embodiment of the present invention. The memory system 300 can be used in a variety of applications. However, it is particularly applicable to an integrated memory system where the memory array and memory controller logic is all one device, allowing for increased optimization of the controller to memory array interface. Additionally, the preferred and illustrated embodiment is used in an integrated cache memory system to improve computer system performance. The preferred embodiment memory system 300 improves memory system performance by increasing the performance of the bit redundancy operation. This is accomplished by splitting the column address strobe signal and providing a direct column address signal to the bit redundancy logic and providing the column address signal for redundancy earlier than the other column address signals.

The major elements of the memory system 300 include a bit decoder 304, a data array 302, steering logic 308 and bit redundancy logic 310. The memory system 300 receives a column address strobe (CAS) for timing and a plurality of column address signals (CAS 0, CAS 1, CAS 2, and CAS 3) to address data in data array 302. These signals are typically provided by the memory controller 301. In the preferred embodiment, the memory controller 301 and memory system 301 are integrated onto a single device, and thus comprise an integrated memory system. The CAS 0–3 signals are latched by buffers L0–L3 respectively. The buffers assure that the CAS 0–3 signals are available for use by bit decode 304 when required.

The data array 302 includes an array of memory storage devices such as SRAM or DRAM. In the preferred embodiment for use as an integrated cache system, the memory comprises a DRAM array. A DRAM array typically comprises multiple sub-arrays called "blocks," with each block comprising an array having a plurality of word lines and bit lines. The DRAM array structure preferably comprises 16 blocks, with each block containing 128 word lines and 2048 bit lines. Additionally, each block preferably contains 32 redundant bit lines. Thus, each block has 128 word lines with each word line accessing 2048 bits plus 32 redundant bits. Of course, other sized memory arrays can be used and may be preferable depending upon the specific application.

The memory system 300 uses bit steering as a way to determine which, if any, of the bits in a column are replaced by one of the redundant bits. This is facilitated by testing the memory system 300 for defective bits during fabrication. The location of defective bit lines is then hardwired into the bit redundancy logic 310, usually by using a laser to blow integrated fuses. When data is accessed, the bit redundancy logic 310 provides steering data to direct the steering logic 308 as to which bits in a selected column are on defective bit lines and need to be replaced by redundant bits on the redundant bit lines. The steering logic then replaces the output of defective bits with the appropriate redundant bit output. Thus, the data output 314 of the steering logic 308 includes a plurality of data lines with any defective bits having been replaced with a redundant bit. This data output 314 can then be used by the computer system. In the integrated DRAM cache example, the data output comprises 128 bits, with up to two of those bits comprising outputs from the redundant bit lines.

Generally, the steering logic 308 outputs data to data output 314 as soon as received from data array 302. If the data arrives from data array 302 before steering data arrives, the incorrect data can be temporarily outputted. Thus, in order to avoid glitches at the data output 314, the correct steering data must arrive at the steering logic 308 before the data arrives from the data array. Otherwise improper data could appear at the data output 314 until the steering data arrives. Thus, the speed at which the memory system 300 operates is often limited by the speed at which the bit redundancy logic 310 provides the correct steering data to the steering logic 308. This is particularly problematic where the bit redundancy logic 310 has a greater propagation delay than bit decode 304 and data array 302.

The bit redundancy logic 310 receives the CAS for timing. Specifically, a column address strobe for the bit redundancy (CASBR), created by transmitting the CAS through DELAY 2, serves as a timing strobe for the bit redundancy logic 310. The timing strobe tells the bit redundancy logic 310 when to provide steering data to the steering logic 308. Likewise, a column address strobe for the bit decode (CASBD), created by transmitting the CAS through a DELAY 1, serves as a timing strobe for the bit decoder 304.

According to the preferred embodiment, the bit redundancy logic 310 also receives a CAS 2 signal. The CAS 2 signal is used in combination with the blown fuses by bit redundancy logic 310 to determine which bits are to be replaced. The bit redundancy logic 310 then provides steering data directly to steering logic 308 to replace the output of a defect bit line with the appropriate redundant bit line output. In the preferred embodiment, with 128 regular bits and 2 redundant bits, the CAS 2 signal used to control which of two sets of bits are to be replaced. Of course, other or additional column address signals (such as any of CAS 0–3) can be used depending upon the bit replacement algorithm used.

As stated before, the steering data must arrive from the bit redundancy logic 310 before the data from data array 302 to avoid output glitches. This is especially difficult where the propagation delay through the bit redundancy logic 310 is greater than the delay through the bit decode 304 and data array 302. Where this is the case, the arrival times of the CAS timing signal and column address signals are critical to control the arrival of the steering data. In particular, it is desirable for the required signals to arrive at the bit redundancy logic 310 such that the output of bit redundancy logic 310 occurs before the output of data array 302. Thus, it is preferable for the CAS timing signal and column address signals to arrive early enough to compensate for any propagation delay through bit redundancy logic 310. The preferred embodiment splits the CAS signal into a CASBR and CASBD through the use of two delays, DELAY 1 and DELAY 2. With DELAY 2 selected to have a shorter delay than DELAY 1, the bit redundancy logic 310 receives CASBR before the bit decode 304 receives CASBD. Preferably DELAY 2 has half the propagation delay or less of DELAY 1.

Additionally, a column address signal is also delivered early to bit redundancy logic 310 to facilitate improved system performance. The bit redundancy logic 310 uses a column address signal to control the granularity of the bits to be replaced. The column address signal selected to be used by bit redundancy logic 310 should be one that will be available from the memory controller 301 as early as possible. In the illustrated embodiment, the CAS 2 signal is used by bit redundancy logic 310 because it is available from the memory system controller 301 significantly before the other column address signals are available. Additionally, the preferred embodiment integrated memory system facilitates the CAS 2 signal being delivered directly to bit redundancy logic 310 by bypassing buffer L2. This assures that CAS 2 will arrive at bit redundancy logic 310 significantly before the CAS 0–3 signals arrive at bit decode 304. In the preferred embodiment CAS 2 arrives at bit redundancy logic 310 3–5 nanoseconds before the CAS 0–3 signals arrive at bit decode 304. In the prior art implementations of the bit redundancy, the column address signals arrive simultaneously to the bit redundancy logic and the bit decode.

Thus, bit redundancy logic 310 receives the required column address signals (such as CAS 2) and timing strobe CASBR before the bit decoder 304 receives the column address signals CAS 0–3 and the timing strobe CASBD. This assures that the steering data arrives at steering logic 308 before the data array output. This reduces the possibility of glitches at the data output 314 of steering logic 308.

Thus, the preferred embodiment of the present invention provides a memory with improved bit redundancy steering performance.

While the invention has been particularly shown and described with reference to a preferred exemplary embodiment thereof, it will be understood by those skilled in the art that various changes in form and details may be made therein without departing from the spirit and scope of the invention. For example, the procedure is equally applicable to any type of computer memory systems that employ bit steering.

We claim:

1. A memory system for use in computer systems, the memory system comprising:

a) a bit redundancy steering mechanism for controlling which bits in said memory system are to be replaced by redundant bits, said bit redundancy steering mechanism having an address signal input and a timing signal input;

b) a memory data array, said data array having a plurality of address signal inputs and a timing signal input;

c) a first timing signal path, said first timing signal path conducting a timing signal to said timing signal input of said bit redundancy steering mechanism;

d) a second timing signal path, said second timing signal path conducting said timing signal to said timing signal input of said memory data array, and wherein said second timing signal path has a propagation delay longer than said first timing signal path;

e) a plurality of address paths, said plurality of address paths conducting a plurality of address signals to said plurality of address signal inputs of said memory data array;

f) a bit redundancy address signal path, said bit redundancy address signal path conducting at least one of said plurality of address signals to said bit redundancy steering mechanism, and wherein said bit redundancy address signal path has a propagation delay shorter than said plurality of address paths.

2. The memory system of claim 1 wherein said memory system is an integrated DRAM cache.

3. The memory system of claim 1 wherein said timing signal is a column address strobe.

4. The memory system of claim 1 wherein said memory data array is a DRAM array.

5. The memory system of claim 1 wherein said propagation delay of said second timing signal path is approximately twice as long as the propagation delay of said first timing signal path.

6. The memory system of claim 1 wherein said plurality of address signal paths comprise a plurality of address signal buffers, and wherein said bit redundancy address signal path bypasses said plurality of address signal buffers.

7. The memory system of claim 1 wherein said plurality of address signal paths comprise a plurality of column address signal paths.

8. The memory system of claim 1 wherein said first timing signal path additionally comprises a first path delay element and wherein said second timing signal path comprises a second path delay element, and wherein said second delay element is has a longer delay than said first delay element.

9. An integrated DRAM memory system for use in a computer system, the integrated DRAM memory system comprising:

a) a bit redundancy steering mechanism for controlling which bits in said memory system are to be replaced by redundant bits, said bit redundancy steering mechanism having a column address signal input and a timing signal input;

b) a memory data array, said data array having a plurality of column address signal inputs and a timing signal input;

c) a first circuit mechanism, said first circuit mechanism providing a timing signal to said memory data array timing signal input through a first delay and to said bit redundancy steering mechanism timing signal input through a second delay and wherein said first delay is longer than said second delay;

d) a second circuit mechanism, said second circuit mechanism providing a plurality of column address signals to said memory data array plurality of column address signal inputs and providing at least one of said plurality of column address signals to said bit redundancy mechanism column address input before said at least one of said plurality of column address signals is provided to said memory data array.

10. The memory system of claim 9 wherein said second circuit mechanism further comprises a plurality of buffers, and wherein said at least one plurality of address signals bypasses corresponding of said plurality of buffers and is connected directly to said bit redundancy steering mechanism.

11. The memory system of claim 9 wherein said memory system is an integrated cache memory system.

* * * * *